United States Patent
Sorge

(10) Patent No.: US 10,658,464 B2
(45) Date of Patent: May 19, 2020

(54) MOS TRANSISTOR FOR RADIATION-TOLERANT DIGITAL CMOS CIRCUITS

(71) Applicant: IHP GmbH—Innovations for High Performance Microelectronics/Leibniz-Institut Fur Innovative, Frankfurt (Oder) (DE)

(72) Inventor: Roland Sorge, Frankfurt (DE)

(73) Assignee: IHP GMBH—INNOVATIONS FOR HIGH PERFORMANCE MICROELECTRONICS/LEIBNIZ-INSTITUT FÜR INNOVATIVE MIKROELEKTRONIK, Frankfurt (Oder) (DE)

( * ) Notice: Subject to any disclaimer, the term of this patent is extended or adjusted under 35 U.S.C. 154(b) by 0 days.

(21) Appl. No.: 15/589,085

(22) Filed: May 8, 2017

(65) Prior Publication Data
US 2017/0338310 A1 Nov. 23, 2017

(30) Foreign Application Priority Data

May 19, 2016 (DE) .................... 10 2016 208 668

(51) Int. Cl.
*H01L 29/10* (2006.01)
*H01L 29/78* (2006.01)
(Continued)

(52) U.S. Cl.
CPC .. *H01L 29/1083* (2013.01); *H01L 21/823493* (2013.01); *H01L 27/088* (2013.01);
(Continued)

(58) Field of Classification Search
CPC ............ H01L 29/1083; H01L 29/0649; H01L 27/088; H01L 29/66712; H01L 29/7803; H01L 29/0878
See application file for complete search history.

(56) References Cited

U.S. PATENT DOCUMENTS 5,200,637 A * 4/1993 Matsuo ............... H01L 29/4238
257/368
5,668,392 A * 9/1997 Huang ................ H01L 29/1087
257/340

(Continued)

FOREIGN PATENT DOCUMENTS

| DE | 19735425 A1 | 5/1998 |
|----|-------------|--------|
| EP | 1 387 494 A1 | 2/2004 |
| WO | 01/37345 A1 | 5/2001 |

OTHER PUBLICATIONS

A. Makihara, et al; "Hardness-by-Design Approach for 0.15 um Fully Depleted CMOS/SOI Digital Logic Devices With Enhanced SEU-SET Immunity"; IEEE Transactions on Nuclear Science; vol. 52, No. 6; Dec. 2005; pp. 2524-2530.

(Continued)

*Primary Examiner* — Mohsen Ahmadi
(74) *Attorney, Agent, or Firm* — Ware, Fressola, Maguire & Barber LLP

(57) ABSTRACT

A monolithically integrated MOS transistor, comprising a doped well region of a first conductivity type, an active MOS transistor region formed in the well region, comprising doped source and drain regions of a second conductivity type and at least one MOS channel region extending between the source and drain regions under a respective gate stack, and a dielectric isolation layer of the STI or LOCOS type and laterally surrounding same, wherein well portions of the well region adjoin the MOS channel region in the two opposite longitudinal directions oriented perpendicular to a (Continued)

notional connecting line extending from the source through the MOS channel region to the drain region, and which extend as far as a surface of the active MOS transistor region, so that the respective well portion adjoining the MOS channel region is arranged between the MOS channel region and the dielectric isolation layer.

11 Claims, 4 Drawing Sheets

(51) Int. Cl.
    *H01L 29/417*     (2006.01)
    *H01L 29/06*     (2006.01)
    *H01L 29/08*     (2006.01)
    *H01L 29/66*     (2006.01)
    *H01L 21/8234*     (2006.01)
    *H01L 27/088*     (2006.01)
    *H01L 21/8238*     (2006.01)

(52) U.S. Cl.
    CPC ...... *H01L 29/0649* (2013.01); *H01L 29/0696* (2013.01); *H01L 29/41758* (2013.01); *H01L 29/78* (2013.01); *H01L 21/823481* (2013.01); *H01L 21/823892* (2013.01); *H01L 29/0878* (2013.01); *H01L 29/66712* (2013.01); *H01L 29/7803* (2013.01)

(56) References Cited

U.S. PATENT DOCUMENTS

| | | | |
|---|---|---|---|
| 6,140,687 A | 10/2000 | Shimomura et al. | |
| 8,890,256 B2 | 11/2014 | Hakey et al. | |
| 9,543,454 B1* | 1/2017 | Lin | H01L 29/866 |
| 2005/0280102 A1* | 12/2005 | Oh | H01L 29/0847 257/401 |
| 2006/0113602 A1* | 6/2006 | Fang | H01L 27/0266 257/368 |
| 2012/0286833 A1* | 11/2012 | Garcia | G06F 1/24 327/143 |
| 2013/0168700 A1* | 7/2013 | Furukawa | H01L 29/7805 257/77 |
| 2014/0124851 A1* | 5/2014 | Gamerith | H01L 29/66712 257/329 |
| 2014/0145290 A1* | 5/2014 | Gu | H01L 29/66143 257/484 |
| 2015/0084125 A1* | 3/2015 | Pala | H01L 21/26506 257/334 |
| 2016/0293615 A1* | 10/2016 | Kwon | H01L 27/11524 |
| 2017/0125584 A1* | 5/2017 | Zhang | H01L 21/26513 |

OTHER PUBLICATIONS

A. Makihara, et al; "Total Ionizing Dose and Single Event Effects Test Results of a Radiation Hardness-By-Design Library for 0.15 um Fully Depleted SOI-AISC"; IEEE; 2009; pp. 602-605.

A. Makihara, et al.; "Raidation Hardness-By-Design Sram Design for 0.15 um Fully Depleted SOI-ASIC"; IEEE RADECS 2011 Proceedings; 2011; pp. 164-168.

Johan Wallden; "Radiation Induced Effects in Electronic Devices and Radiation Hardening by Design Techniques"; University of Linkoping, Electronic Components Department of Electrical Engineering; Jun. 13, 2014; whole document.

"Space Product Assurance—Technique for Radiation Effects Mitigation in ASICs and FPGAs Handbook"; ECSS-Q-HB-60-02A; ESA Requirements and Standards Division; Sep. 1, 2016; whole document.

* cited by examiner

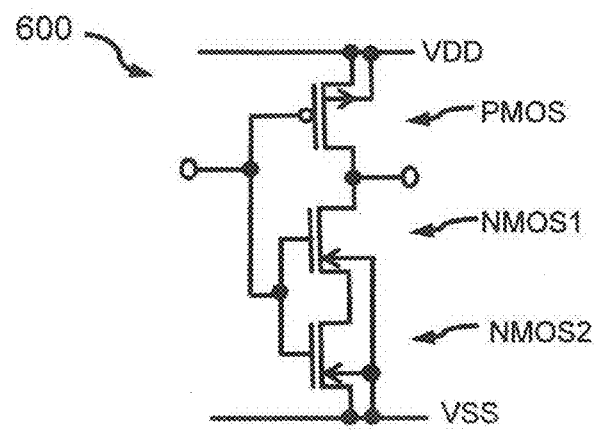
Fig. 6 - Prior Art -
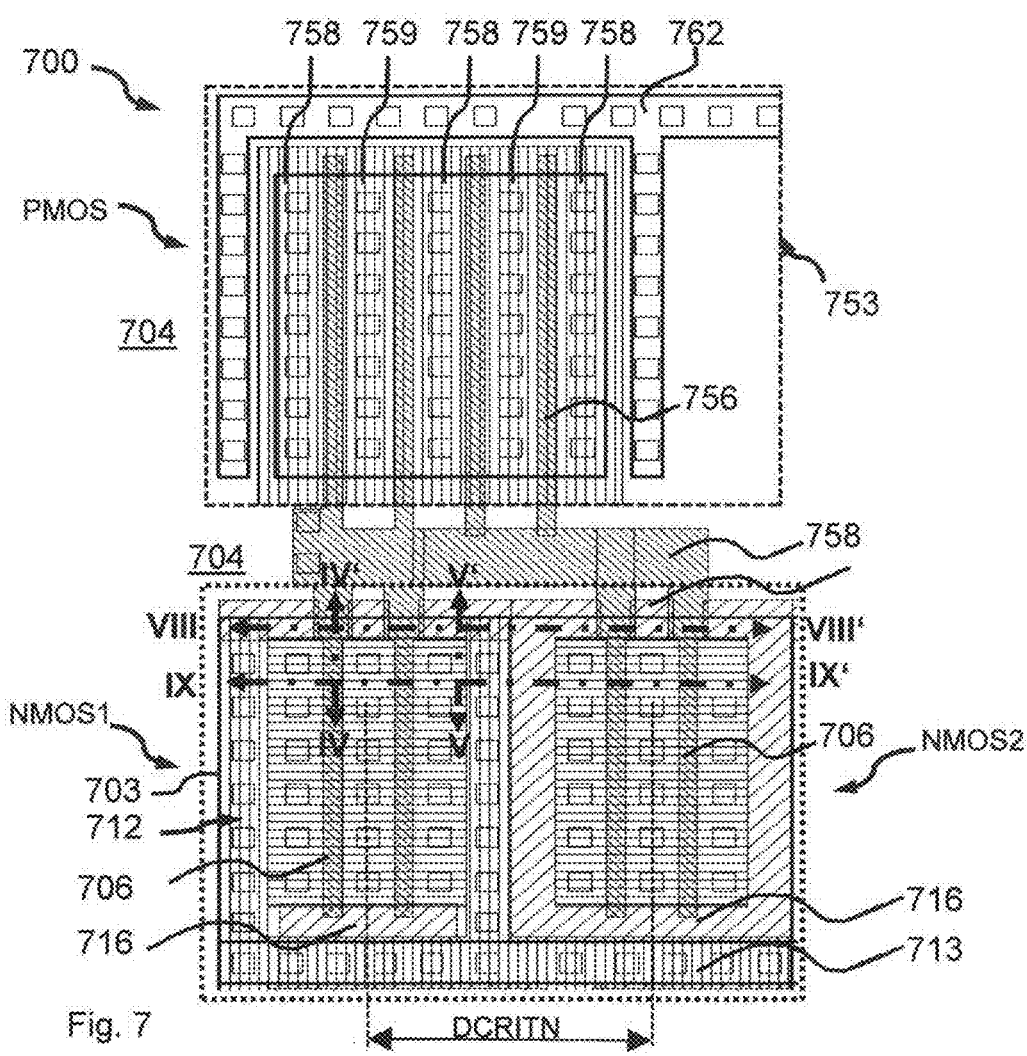
Fig. 7

MOS TRANSISTOR FOR RADIATION-TOLERANT DIGITAL CMOS CIRCUITS

CROSS REFERENCE TO RELATED APPLICATION

This application claims priority under 35 USC § 119 to German Patent Application No. 10 2016 208 668.5 filed on May 19, 2016, which application is hereby incorporated by reference in its entirety.

TECHNICAL FIELD

The invention relates to a monolithically integrated metal-oxide-semiconductor (MOS), transistor and a monolithically integrated digital MOS circuit.

BACKGROUND OF THE INVENTION

Digital electronic circuits are subject to special levels of radiation exposure, particularly when used in the aerospace industry, in high-energy physics and in nuclear medicine. Ionizing radiation causes changes in the channel conductivity of a MOS transistor, due to the influence of positively charged holes trapped in lateral dielectric isolation layers, such as shallow trench isolation (STI) layers or local oxidation of silicon (LOCOS) layers. This effect is called the total ionizing dose (TID) effect. The TID effect thus causes undesired, greatly increased leakage currents between the source and drain of MOS transistors that are exposed to ionizing radiation.

The use of enclosed layout transistors (ELT) to prevent TID effects is known from the prior art. A ring-shaped design of the MOS gate separating the source and drain from each other prevents changes in the channel conductivity of MOS transistors due to TID effects. One disadvantage of enclosed layout MOS transistors, however, is that it is not possible to implement minimal gate widths that are otherwise technologically feasible. The structure of such transistors is also highly asymmetric, with large differences in the source and drain areas. As a final point, such transistor structures take up significantly more area compared to a transistor arrangement with a linear MOS transistor layout.

SUMMARY OF THE INVENTION

According to one aspect of the present invention, a monolithically integrated MOS transistor is proposed, comprising
a doped well region of a first conductivity type;
an active MOS transistor region formed in the well region, comprising doped source and drain regions of a second conductivity type and at least one MOS channel region extending between the source and drain regions under a respective gate stack;
a dielectric isolation layer of the STI or LOCOS type adjacent the active MOS transistor region and laterally surrounding same, wherein
well portions of the well region which adjoin the MOS channel region in the two opposite lateral longitudinal directions oriented perpendicular to a notional connecting line extending from the source through the MOS channel region to the drain region, and which extend as far as a surface of the active MOS transistor region, so that the respective well portion adjoining the MOS channel region is arranged between the MOS channel region and the dielectric isolation layer.

The MOS transistor according to the invention is based, inter alia, on the discoveries described below:

In prior art MOS transistors exposed to ionizing radiation, the channel conductivity is modified, as already explained, by the influence of the positive charges trapped in the dielectric isolation layers (STI or LOCOS isolation) laterally adjoining in the longitudinal direction. For an NMOS transistor, this results in increased channel conductivity due to enrichment with majority charge carriers, i.e., electrons, in the channel region. This causes an undesired increase in the level of leakage current. For a PMOS transistor, in contrast, the result is a reduced channel conductivity due to the depletion of majority charge carriers, i.e., holes, in the channel region.

In the MOS transistor according to the invention, such undesirable changes in channel conductivity are avoided by providing blocking sections between the MOS channel region and the dielectric isolation regions laterally adjacent in the longitudinal direction, by means of additionally inserted lateral portions of the well region, referred to here as well portions. These well portions of the doped well region laterally adjoin the MOS channel region on both sides, in the longitudinal direction transverse to the direction of current flow in the MOS channel region, and extend there as far as the surface of the active MOS transistor region. The well portion laterally adjoining the MOS channel region is arranged between the MOS channel region and the inner side of the dielectric isolation layer facing the active MOS transistor region.

These well portions can also be referred to as junction-isolating well portions. An advantageous barrier effect is always achieved by a self-adjusting potential difference between the respective well portion and the MOS channel region, without a voltage having to be additionally applied. Any changes in the fixed charge at the lateral interfaces between the respective well portion and the dielectric isolation region thus have no effect on the MOS channel region, and hence have no effect on the electrical parameters of the MOS transistor. In other words, the inversion channel in the channel region does not "sense" any changes in the fixed charge at the interface with the dielectric isolation region, due to the laterally adjacent junction-isolating well portion. Undesirable changes in the channel conductivity of MOS transistors is successfully suppressed in this manner.

The two opposite longitudinal directions are therefore oriented transversely to the direction of current flow in the MOS channel. For the sake of simplicity, they are also referred to collectively as "the longitudinal direction" in the present description, unless it is important in the respective context to make a distinction between these two longitudinal directions.

Embodiments of the inventive MOS transistor shall now be described.

In contrast to the enclosed layout transistors (ELT) described in the prior art, the proposed MOS transistor according to the invention allows embodiments with linear gate structures to be produced. In such embodiments with linear gate structures, the gate stack and the MOS channel region extend in a straight line in the longitudinal direction. This minimizes the area required by radiation-tolerant integrated digital memory or logic circuits, which typically contain very large numbers of such MOS transistors. Variants of these embodiments which are particularly space-saving have minimal channel widths that are determined solely by the scaling level of a respective CMOS technology.

The lateral extension in the longitudinal direction of the junction-isolating well portions (in other words, the width of said well portions) may be limited to a minimum on both sides of the channel region. It makes sense to choose a minimum which is just about sufficient to suppress the TID effect, so as to keep the area required by the MOS transistor as small as possible. Such a minimum necessary extension of the junction-isolating well portions in the active MOS transistor region is dependent on the respective scaling level of the MOS technology being used. The lateral extension of each well portion in the longitudinal direction is preferably between 10 and 500 nanometers. A minimum of at least 0.4 µm has proved sufficient for NMOS transistors in 0.25 µm CMOS technology, for example. In the case of a technology with a higher level of scaling, i.e., with smaller web widths, that minimum can be further reduced. It is typically about 1.5 times greater than the web width of the technology being used. In some embodiments, the width of the junction-isolating well portions is the same at both longitudinal ends of the channel region. In other embodiments, it differs at the two longitudinal ends of the channel region.

The depth to which the well portions extend is typically greater than the depth to which the adjacent dielectric isolation layer extends, because the well portions are part of the well region and therefore extend to the same depth to which the well region itself extends. The well region typically extends to a greater depth than the dielectric isolation layer, which is also referred to explicitly in one variant of the invention as a "shallow" isolation layer.

In some embodiments, an additional junction-isolating well portion is used, which extends in extension of the notional connecting line from the source region to drain region as far as the surface of the active MOS transistor. This additional well portion of the well region is thus arranged between the source region and the drain region and the dielectric isolation layer. This additional junction-isolating well portion also provides lateral isolation of the source region and the drain region of a MOS transistor from the source/drain regions of the adjacent MOS transistors.

In preferred embodiments of the invention, the surface of the active MOS transistor region above the respective junction-isolating well portion is covered with a silicide blocker layer made of an electrically insulating material. This blocker layer prevents the formation of silicide in those regions where it can undesirably occur in some production processes. This prevents short-circuits from occurring on the surface in the junction-isolated regions of the MOS transistor.

In one development of the inventive MOS transistor according to a second aspect of the invention, a monolithically integrated digital MOS circuit is proposed which has at least one MOS transistor according to one of the embodiments of the first aspect of the present invention, and at least one more monolithically integrated component. This additional monolithically integrated component may also be another MOS transistor according to the invention. Such a monolithically integrated digital MOS circuit thus contains two circuit cells having at least one MOS transistor according to the first aspect or one of its embodiments. This MOS circuit accordingly shares the advantages of the MOS transistor according to the first aspect of the invention.

Preferred embodiments of the MOS circuit according to the second aspect are additionally protected against SET and SEU effects. These undesired effects shall firstly be described below. Prior art circuits for preventing these undesirable effects are then discussed, before advantageous features of the preferred embodiments of the MOS circuit according to the second aspect are described in that context.

In a digital circuit, exposure to radiation in the form of heavy and energy-rich ionized particles can cause strong production of additional electron/hole pairs in MOS component regions at pn-junctions poled in the reverse-bias direction. The strong concomitant increase in well currents results in a strong local change in potential in the respective well region, particularly around any MOS source regions that are affected. These local changes in potential are all the greater, the greater the connection resistance of the well regions to VDD or Vss. Base-emitter pn-junctions of parasitic bipolar transistors lying parallel to drain and source regions of the MOS transistor are forward-biased as a result. This causes transient switching on of the parasitic bipolar transistors lying between the drain and source regions of the MOS transistors, which in turn causes a transient change in the logic signal level at the output of the logic gate affected. This effect is called SET (single event transient). Due to MOS transistors losing their blocking capacity, transient malfunctions occur at the outputs of digital combinatorial circuits. If such a SET signal is propagated in combinatorial circuit elements and is ultimately stored in registers such as latches or flip flops (SEU, single event upset), the logic state of a digital circuit is permanently and erroneously changed. In summary, malfunctions in digital circuits are also produced by SET/SEU effects, namely the loss of gate control in MOS transistors, which is produced by parasitic bipolar transistors lying parallel to drain and source regions being switched on and off when the circuit is exposed to radiation in the form of high-energy heavy ionized particles.

Monolithically integrated digital MOS circuits which reduce these effects are known, for example, from the following publications:

(1) Johan Walldén, "Radiation Induced Effects in Electronic Devices and Radiation Hardening By Design Techniques", University of Linköping, Electronic Components Department of Electrical Engineering, SE-581 83 Linköping, SRN LiTH-ISY-EX-14/4771-SE, 2014-06-13. This publication is referred to in the following as (1).

(2) "Space Product Assurance—Technique for Radiation Effects Mitigation in ASICs and FPGAs Handbook", ECSS Standard, Draft, 30 Oct. 2015, ESA Requirements and Standards Division, ESTEC, P.O. Box 299, 2200 AG Noordwijk, The Netherlands. This publication is referred to in the following as (2).

(3) "CMOS circuits with protection for a single event upset", EP1 387 494 A1. This publication is referred to in the following as (3).

As noted in cited publications (1) and (2), efforts are made to improve the reliability of digital CMOS circuits exposed to radiation in the form of high-energy heavy ions by adding redundancy at the circuitry level and at the system level. At the circuitry level, approaches such as triple mode redundancy (TMR) and dual interlocked storage cells (DICE) are pursued in order to reduce sensitivity to SET effects. At the system level, efforts are made to improve error tolerance by using redundant arrangements of processor cores and by applying error correction algorithms. However, adding redundancy at the circuitry and system levels greatly increases the area required for the circuit layout, raises the power consumption of the circuit and requires a large amount of system overhead with regard to both hardware and software.

An alternative proposed in publication (3) involves redundancy at the transistor level.

In some important advancements on these techniques, described below, embodiments of the MOS circuit according to the invention utilize this circuit design principle of redundancy at the transistor level to prevent SEU effects, namely in the NMOS path or in the PMOS path, but preferably in both the NMOS path and the PMOS path. In other words, each circuit engineering function of NMOS transistors and/or each circuit engineering function of PMOS transistors is performed by a dual MOS transistor structure. In the inventive MOS structure for preventing SEU effects, which is referred to in the following as a common-gate MOS transistor structure, a substantial reduction in the well connection resistance to VDD and VSS is achieved by means of special circuit design measures, unlike the dual MOS transistor structure described in publication (3), thus shortening any SET events and contributing significantly to the prevention of SET events. A common-gate MOS transistor structure contains two MOS transistors connected in series according to the first aspect of the invention or one of the embodiments described. These two MOS transistors are of an identical conductive type and are connected via a common gate electrode. The source and drain regions of the two spatially separated MOS transistors are not fused with each other, but are connected with each other in series via a metallic conductive path. This dual MOS transistor structure is a logic AND gate.

In one preferred variant, the common-gate MOS transistor structure consists of two such MOS transistors according to the first aspect of the invention. Such a structure is also referred to here as a junction-insolated common-gate (JICG) MOS transistor structure.

In some embodiments, every circuit engineering function of NMOS transistors and every circuit engineering function of PMOS transistors in the MOS circuit according to the second aspect of the invention is performed by such a JICG MOS transistor structure. For a given conventional circuit layout, for example for a CMOS gate, any MOS transistor in the circuit layout which is not protected against SEU and TID is then replaced by the JICG MOS transistor structure, that is to say, by series-connected MOS transistors of the same conductivity type according to the invention, the gates of which are connected with each other.

The MOS transistors of the JICG MOS transistor structure are preferably formed in a common active MOS transistor region. In addition to the advantageous features of the MOS transistor according to the first aspect of the invention, advantageous embodiments of this JICG MOS transistor structure are distinguished by allowing a low-impedance drain of majority charge carrier currents in the well regions so as to suppress SET and SEU effects. This is achieved by the JICG MOS transistor structure having not only a first well connection region at one of the longitudinal ends of the well region but also a second well connection region between the source or drain regions of a first of the two MOS transistors and the source or drain regions of a second of the two MOS transistors of the common-gate MOS transistor structure. All the source and drain regions of the two MOS transistors (reverse-biased in operation) are thus surrounded by the associated well connection regions, which extend as far as the surface. The second well connection region provided between the two spatially separated MOS transistors of the JICG MOS transistor structure preferably has about the same extension in the longitudinal direction as the source/drain regions of the two MOS transistors. It may also extend a little further. With the additional features mentioned in this paragraph, which can each be implemented individually but which are preferably implemented cumulatively, particularly short SET events can be achieved by keeping the connection resistances of the well regions to VDD and VSS particularly low. This applies not only for embodiments which use an N-well region, but also for those which use a P-well region. The connection resistance relates to the connections to VDD for JICG-PMOS transistors and to VSS for JICG-NMOS transistors.

In advantageous embodiments of the MOS circuit, a second additional well portion (702D) of the well region extends in one of the MOS transistors of the common-gate MOS transistor structure in extension of the notional connecting line from the source region to the drain region as far as a surface of the active MOS transistor region, wherein the additional well portion of the well region is arranged between the source region or the drain region and the (second) well connection region.

In the circuit layout, a spacing between regions of the two MOS transistors of the JICG MOS transistor structure, which is reverse-biased in operation, is preferably selected to be so large that, in the event of a single heavy, high-energy ion impacting, a SET effect occurs in only one of the two MOS transistors. The spacing is therefore greater than the effective, energy-dependent radius of a cloud of electron/hole pairs generated when a particle impacts an MOS transistor of the JICG MOS transistor structure. To that end, it is preferred that the source/drain regions of the MOS transistors of the JICG MOS transistor structure are arranged along the connecting line at a distance from each other which is at least ten times greater than a predetermined minimum gate length that can be achieved by any production technology that is used. The non-occurrence of SEU events has been experimentally proved for a 1024-stage CMOS inverter circuit implemented in a 0.25 μm CMOS technology and with a distance of 4.1 μm between the drain regions in JICG NMOS transistor structures, for a local energy transfer of 67.9 MeV cm$^2$/mg with xenon ions into the silicon substrate. That is an excellent result.

The AND function realized in JICG MOS transistor structures by the connected gates of the MOS transistors connected in series results in the blocking capacity being maintained in at least one of the two transistors, thus preventing the malfunctioning of CMOS gates due to SET effects, as known from the prior art.

BRIEF DESCRIPTION OF THE DRAWINGS

Further embodiments shall now be described below with reference to the Figures, in which:

FIG. 6 shows a circuit diagram of a prior art CMOS inverter circuit for describing the embodiment in FIG. 7;

FIG. 7 shows a layout of an embodiment of a CMOS inverter circuit according to the present invention;

DETAILED DESCRIPTION

Figure 1:
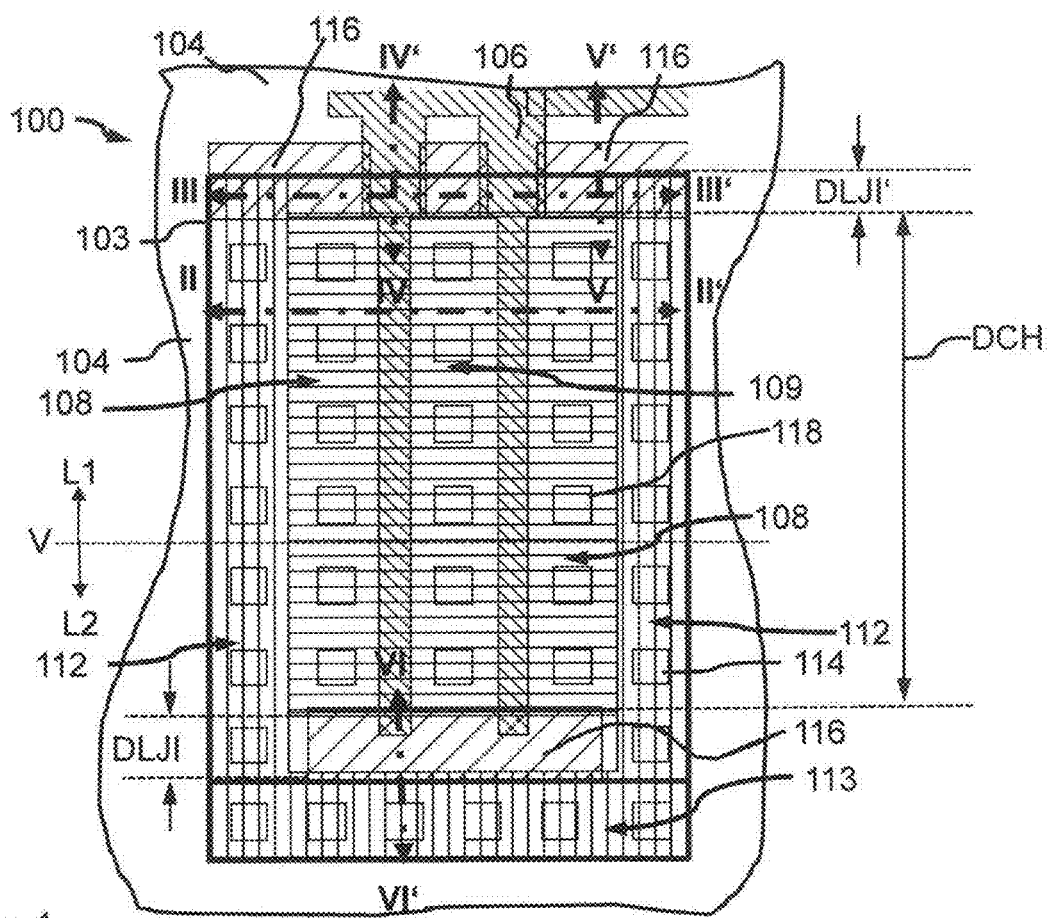
FIG. 1 shows a layout of an embodiment of a MOS transistor according to the present invention.
Figure 2:
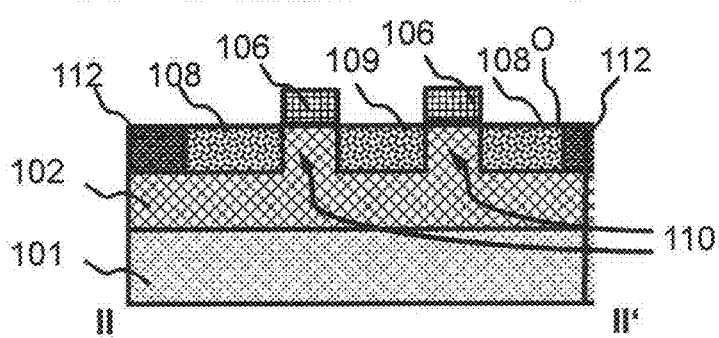
FIG. 2 shows a cross-sectional view of the embodiment in FIG. 1 along line II-II'.
Figure 3:
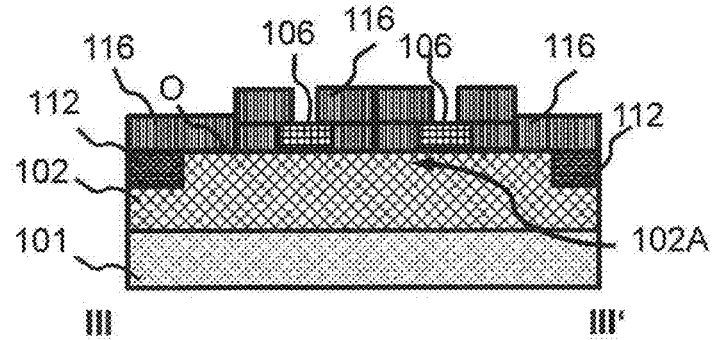
FIG. 3 shows a cross-sectional view of the embodiment in FIG. 1 along line III-III'.
Figure 4:
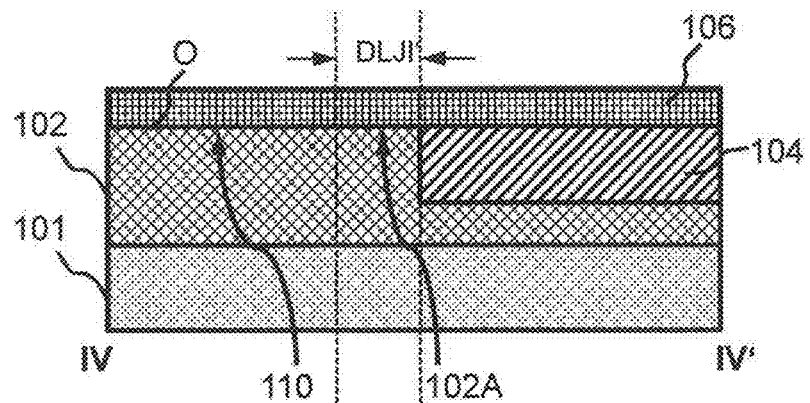
FIG. 4 shows a longitudinal cross-sectional view of the embodiment in FIG. 1 along line IV-IV'.
Figure 5:
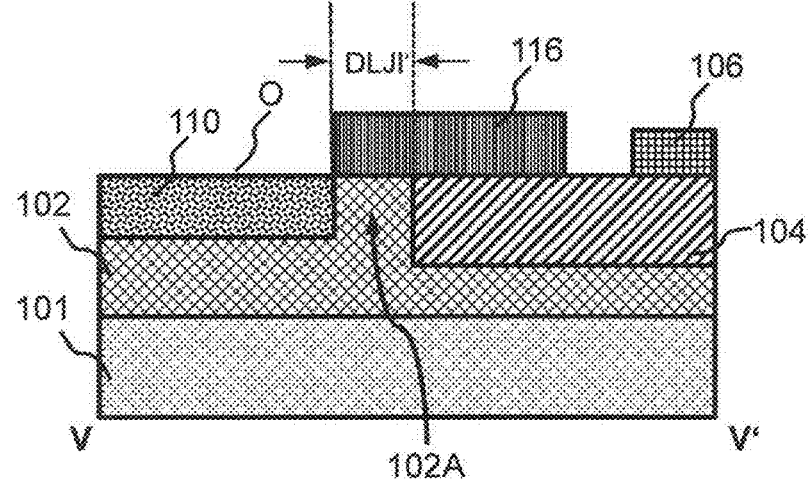
FIG. 5 shows a longitudinal cross-sectional view of the embodiment in FIG. 1 along line V-V'.
Figure 5A:
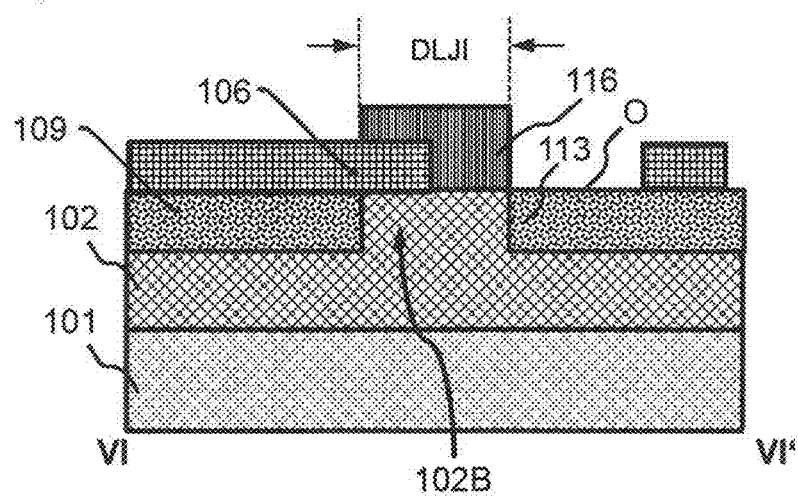
FIG. 5A a longitudinal cross-sectional view of the embodiment in FIG. 1 along line VI-VI'.

In the following, parallel reference is made to FIGS. 1-5 and 5A. FIG. 1 is a layout view of an embodiment of a MOS transistor according to the present invention. FIGS. 2-5 and 5A show different cross-sectional views of said MOS transistor. FIG. 2 is a cross-sectional view of the embodiment in FIG. 1, along line FIG. 3 is a cross-sectional view of the embodiment in FIG. 1 along line III-III'. FIG. 4 shows a longitudinal cross-sectional view of the embodiment in FIG. 1 along line IV-IV. FIG. 5 shows a longitudinal cross-sectional view of the embodiment in FIG. 1 along line V-V. Finally, FIG. 5A shows a longitudinal cross-sectional view of the embodiment in FIG. 1 along line VI-VI'.

The layout, shown in FIG. 1, of an NMOS transistor 100 on a p-doped silicon substrate 101, includes an active MOS transistor region 103 which is surrounded on all sides by a shallow dielectric isolation layer 104 of the STI or LOCOS type. The active MOS transistor region 103 is in the form of a p-doped well region 102. Well region 102 extends laterally on all sides, also underneath the shallow dielectric isolation region (field oxide region) 104, which is not specifically shown in the cross-sectional views in FIGS. 2 and 3. However, the longitudinal cross-sectional views in FIGS. 4 and 5 shows this clearly.

The transistor here is a field-effect transistor with a two-fingered gate. However, other known transistor structures with more or less than two gate fingers can also be used in a transistor structure according to the invention. A linear MOS channel region 110 extends in a longitudinal direction under a two-fingered gate in this case (slanted hatching in FIG. 1) and under a gate stack 106 which is not shown in any further detail in the sectional drawings. The two opposite longitudinal directions are marked in FIG. 1 with arrows L1 and L2. Each of the MOS channel regions 110 are arranged between a respective doped source region 108 and a doped drain region 109 in the middle (horizontal hatching in FIG. 1). The active MOS transistor region 103 has well connection regions 112 and 113 on all three sides.

To prevent the TID effect, the MOS transistor in the present embodiment has well portions 102A of well region 102, which adjoin MOS channel region 110 in both the opposite longitudinal directions L1, L2 oriented perpendicular to a notional connecting line V and which extend as far as a surface O (also referred to as the top side) of active MOS transistor region 103 (see FIG. 4). The respective well portion 102A adjoining MOS channel region 110 is thus arranged with a width DLJI between MOS channel region 110 and dielectric isolation layer 104. In the present embodiment, in addition, well connection region 113 is arranged between well portion 102A and dielectric isolation layer 104. Although this is a solution which makes technical sense in a CMOS circuit and which is therefore preferred as a solution for contacting many components on a substrate, it is not an essential measure for preventing the TID effect, but an option. Other embodiments, not shown here, do not have well connection region 113, where well portion 102A directly adjoins dielectric isolation region 104.

When manufacturing the present MOS transistor 100, a channel width DCH of the MOS transistor is not set by the width of the active transistor region 103, as is otherwise usual in CMOS technologies, but by a lithographical width of an opening in a source/drain mask (not shown), with the aid of which the source/drain regions are doped.

Thus, in an MOS transistor 100, undesired changes in channel conductivity due to the effects of ionizing radiation are prevented by creating additionally inserted lateral well portions 102A of well region 102 between MOS channel region 110 and the dielectric isolation regions 104 laterally adjacent thereto in the longitudinal direction. These well portions 102A of doped well region 102 adjoin MOS channel region 110 at each of its longitudinal ends. They extend there, as can be seen in FIGS. 3-5, as far as the surface O of active MOS transistor region 103. The respective well portion 102A adjoining the respective longitudinal end of MOS channel region 110 is thus arranged between MOS channel region 110 and the inner side of the dielectric isolation layer 104 facing the active MOS transistor region there.

These well portions 102A are also referred to here as junction-isolating well portions. This is because an advantageous barrier effect is always provided by self-adjusting potential difference between the respective well portion 102A and MOS channel region 110, without any additional voltage having to be applied. As a result, any changes in fixed charge at the lateral interfaces between the semiconductor material of the MOS channel regions and the dielectric isolation region 104 have no effect on the MOS channel region and therefore have no effect on the electrical parameters of MOS transistor 100. Due to the laterally adjacent junction-isolating well portion 102A, an inversion channel in MOS channel region 110 does not "sense" any changes in fixed charge at the interface with dielectric isolation region 104. This allows the undesired changes in the channel conductivity of MOS transistor 100, caused by the TID effect, to be successfully suppressed.

The extension of inserted well portions 102A in the longitudinal direction is marked DLJI and Dill' in FIGS. 1, 5 and 5A. Its minimum value technically necessary in order to achieve the screening effect described in the foregoing is dependent on the scaling level of the MOS technology used in production. It ranges between 10 and about 500 nanometers, depending on the level of scaling. A distance DLJI of 0.4 µm has proved sufficient for NMOS transistors in 0.25 µm CMOS technology, for example. By using junction-isolating well portion 102A, it is possible to produce linear MOS transistors which have minimal channel widths and are protected against the TID effect, with dimensions that are determined solely by the respective scaling level of the CMOS technology being used.

It has proved to be advantageous to cover the surface O of active MOS transistor region 103 above the respective junction-isolating well portion 102A with a structured silicide blocker layer 116 (slanting hatching with large line spacing in FIG. 1) made of an electrically insulating material. This allows MOS channel regions 110 and source regions 108 to be laterally isolated by stopping any undesired formation of silicide on the surface in these regions.

Arranging well connection region 112 (vertical hatching in FIG. 1) on both sides of source regions 108, as shown in FIG. 1, produces advantages in suppressing undesired SET and SEU effects. In this design, all the source regions 108 and drain regions 109 of the MOS transistor, which are reverse-biased in operation, are arranged close to well connection region 112. This allows majority charge carrier currents caused by SET to drain with low impedance from well region 102. The low connection resistance of well region 102 thus achieved helps to keep SET events short-lived and thus to significantly reduce the likelihood of an SEU effect.

A well connection region 113 forms the lengthwise end of active MOS transistor region 103.

FIG. 1 also shows, with reference sign 114, examples of contact structures of MOS transistor 100 for the U-shaped well connection regions 112 and 113, and with reference sign 118 examples of contact structures for source regions 108 and drain regions 109.

MOS transistor 100 may be embodied as an NMOS transistor or as a—PMOS transistor. In the case of an NMOS transistor, well region 102 is typically p-doped, whereas source/drain regions 108, 109 are heavily n-doped and well connection regions 112 and 113 are heavily p-doped. In the case of a PMOS transistor, the well region 102 is typically n-doped, whereas source/drain regions 108, 109 are heavily p-doped and well connection regions 112 and 113 are heavily n-doped.

Design principles for improving the tolerance of integrated digital CMOS circuits to the effects of ionizing radiation (TID effects) and heavy, high-energy ions (SET and SEU effects) shall now be described for the example of a CMOS inverter and with reference to FIG. 6-9, without any limitation of the potential applications of the invention being implied thereby.

Figure 8:
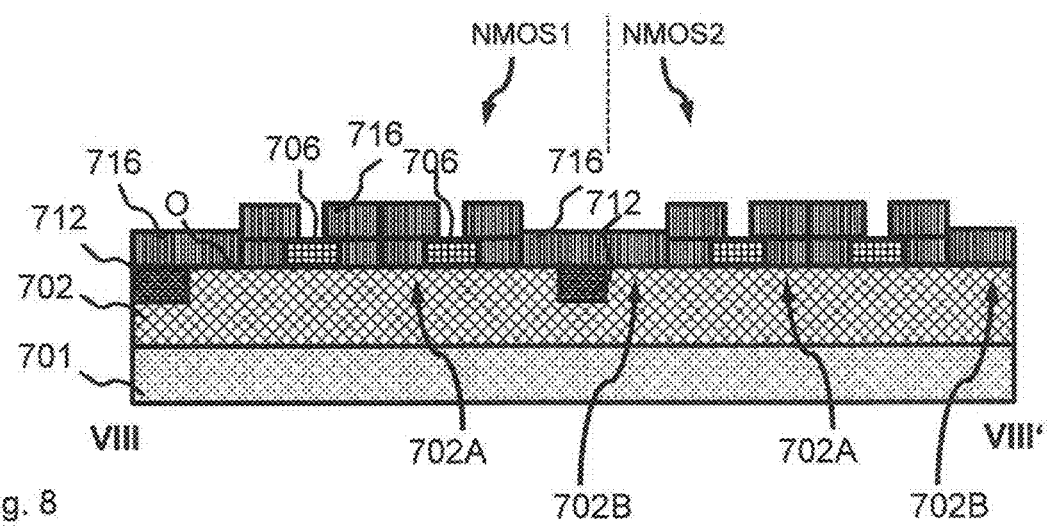
FIG. 8 shows a cross-sectional view of the embodiment in FIG. 7 along line VIII-VIII'.
Figure 9:
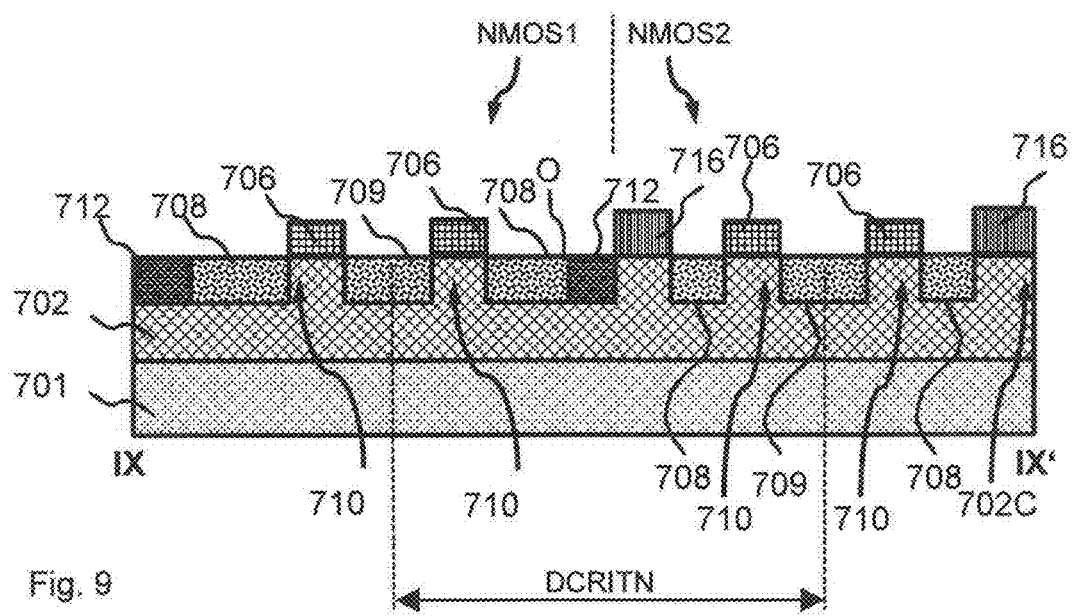
FIG. 9 shows a cross-sectional view of the embodiment in FIG. 7 along line IX-IX'.

FIG. 6 shows a prior art circuit diagram of a CMOS inverter circuit for describing the embodiment in FIG. 7. Similarly to FIG. 1, FIG. 7 shows a layout view, in this case an embodiment of a monolithically integrated MOS inverter circuit. FIG. 8 shows a cross-sectional view of the embodiment in FIG. 7 along line VIII-VIII'. FIG. 9 shows a cross-sectional view of the embodiment in FIG. 7 along line IX-IX'.

The circuit diagram in FIG. 6 illustrates the principle of redundancy at transistor level, in order to prevent single-event transients in any NMOS path in a CMOS gate. Such a circuit of a radiation-tolerant CMOS inverter, with redundancy at transistor level, can be used not only on the NMOS path, but also on the PMOS path of the inverter. Although the latter is now shown in the present example, it is familiar to a person skilled in the art. Thus, in the present example of an inverter circuit 600, there is a single PMOS transistor PMOS. Instead of a single NMOS transistor as in a conventional inverter circuit, a JICG NMOS transistor structure comprising two series-connected NMOS transistors NMOS1 and NMOS 2 and with interconnected gates is provided in this example. The AND function of transistors NMOS1 and NMOS2, thus implemented, allows the blocking capacity to be maintained in the NMOS path in the event a heavy, high-energy ionized particle impacting the transistor regions of NMOS1 or NMOS2.

In one variant, not shown here, PMOS transistor PMOS is thus replaced, alternatively or additionally, by a JICG PMOS transistor having two PMOS transistors connected in series and having interconnected gates. The AND function of the PMOS transistors, thus implemented, allows the blocking capacity to be maintained in the PMOS path in the event a heavy, high-energy ionized particle impacting the transistor regions of either of the two PMOS transistors.

FIG. 7 shows the layout of a CMOS inverter 700, as an embodiment of the invention for monolithically implementing the circuit of FIG. 6. The layout of NMOS transistor NMOS1 is the same as the embodiment discussed with reference to FIGS. 1-5. To keep the present description short and to avoid repetition of statements already made above, reference signs for structural elements are altered in FIGS. 7-9 only in their first digit, compared to said embodiment in FIGS. 1-5, so they have a 7 instead of a 1 as the first digit when the structure and function of those elements is the same as those described above. In describing the structural elements in FIGS. 7-9, additional reference can thus be made to the description of FIGS. 1-5 as well.

Further details of the CMOS inverter in FIGS. 7-9 shall now be described.

As is generally the case in CMOS technology, active transistor regions 703 and 753 made of silicon contain n- and p-doped wells, with highly-doped gate, source and drain regions and well connections having the respective contacts.

A PMOS transistor (reference sign PMOS) is formed in active region active 753. The active region is surrounded laterally by a shallow dielectric isolation region (field isolation region) 704, which is not shown in any further graphic detail here. Active region 753 contains a four-fingered gate structure with four gate strips under gate stacks 756 between p-doped PMOS source and drain regions 758, 759. An n-doped well connection region 762 of inverted U-shape surrounds the source/drain regions in the active PMOS transistor region on three sides. Only those parts within active region 753 that are relevant for CMOS inverter 700 are shown graphically in FIG. 7. The lateral boundary of active region 753 on the right-hand side in the top view shown in FIG. 1 is drawn by way of example only and can be changed according to requirements.

The gate fingers of the PMOS transistor are connected with the gate fingers of the two redundant NMOS transistors NMOS1 and NMOS2 via a gate contact structure 758.

NMOS transistors NMOS1 and NMOS2 are disposed entirely within one and the same active MOS transistor region 703 made of silicon, which has a well region 702, in this case an n-well region on a substrate 701, as in the example shown in FIGS. 1-6. Lateral isolation of MOS channel regions 710 from NMOS1 and NMOS2 and the source regions of NMOS2 is ensured by the structured silicide blocker layer 716, which stops any silicide formation in said regions. The latter layer is also called a salicide block layer.

The additional well portions, described at length with reference to FIGS. 1-6, are located here in the two transistors NMOS1 and NMOS2 and are marked with reference signs 702A, 702B and 702C. The longitudinal cross-sections in FIGS. 4 and 5 also apply to the present embodiment, so their position is likewise shown in the layout in FIG. 7. These longitudinal cross-sections also apply for corresponding positions of NMOS transistor NMOS2.

Drain regions 709 of NMOS transistors NMOS1 and NMOS2, which are arranged laterally adjacent one another here, are placed at a distance DCRITN apart. The geometrical spacing DCRITN between the blocked pn-junctions, which are sensitive to SET events, in the transistor regions of NMOS1 and NMOS2 is crucial for maintaining blocking capacity in the NMOS path. DCRITN must be suitably chosen in the layout and should always be greater than the effective, energy-dependent radius of a cloud of electron/hole pairs generated when a particle impacts the transistor region of NMOS1 or NMOS2.

In the present case, based on the example of a 0.25 µm CMOS technology, a spacing of 4.5 µm is provided.

In irradiation tests with gamma radiation and a dosage of 1.5 Mrad, a leakage current level of less than 4 pA per gate finger has been demonstrated for digital CMOS circuits structured with the arrangement shown in FIG. 7. The leakage current level of tested digital CMOS circuits according to the prior art, used as a basis for comparison, was 2 nA per gate finger. For digital CMOS circuits manufactured with a layout according to FIG. 7, no SET effects whatsoever were observed in irradiation tests using high-energy xenon ions ($^{131}$Xe+35 at 1217 MeV) up to very high LET values (LET: linear energy transfer) of 67.9 MeVcm$^2$/mg. In contrast, malfunctions due to SET effects were detected at LET values less than 10 MeV×cm$^2$/mg with a standard CMOS inverter manufactured with a layout according to the prior art.

Thus, to summarize, instead of the usual lateral dielectric isolation of the MOS channel by means of STI or LOCOS, lateral junction isolation of the MOS channel is additionally provided, which prevents changes in the conductivity of the MOS channel caused by the influence of positive charges trapped in the STI or LOCOS layer and induced by TID effects. This lateral junction isolation is produced by narrow lateral well portions that are additionally provided in the active silicon region between the MOS channel and the lateral STI or LOCOS isolation regions. To prevent any short circuits on the surface of the active MOS transistor region to the source/drain regions of adjacent MOS transistors, these well portions are preferably covered with a structured silicide blocker layer.

In preferred applications, two MOS transistors of the same conductivity type and having a common gate electrode are connected in series with each other in order to prevent SET and SEU effects. The spacing between the reverse-biased drain regions of the two single transistors in the layout is set such that it is always greater than the effective radius of impacts of heavy, energy-rich ions into the silicon region of the transistor arrangement. In order to keep the duration of SET events short and to prevent SEU events, the connection between the well regions and VDD or VSS must be designed with as low an impedance as possible. This is achieved by having all the reverse-biased source/drain regions of the transistor arrangement surrounded by the associated well regions, which are formed entirely within the active silicon region and extend as far as the surface, and by arranging a common well connection region with the width of the source/drain regions of the two MOS transistors between the drain region of the first transistor and the source region of the second transistor of the JICG MOS transistor structure. The source and drain regions of the two series-connected and spatially separated MOS transistors are not simply fused with each other, but are spatially separated from each other by a well region and connected with each other via a metallic conductive path, thus allowing the well currents to drain with a particularly low impedance in order to suppress SET and SEU effects.

LIST OF REFERENCE SIGNS

100 MOS transistor
101 Substrate
102 Well region
102A Junction-isolating well portions
102B Junction-isolating well portions
103 Active MOS transistor region
104 Dielectric isolation layer
106 Gate stack
108 Doped source region
109 Doped drain region
110 MOS channel region
112 Well connection region having the same width as the source region of the MOS transistor, extending as far as the surface, and arranged directly beside the source region for low-impedance drain of generated well current to VSS
113 Well connection region
114 Contact in the well connection region
116 Silicide blocker layer
600 CMOS inverter circuit with redundancy at transistor level to prevent SEU effects
700 Layout of a monolithically integrated CMOS inverter with JICG NMOS transistor arrangement to prevent TID and SEU effects
701 Substrate
702 Well region
702A Junction-isolating well portion
702B Junction-isolating well portion
702C Junction-isolating well portion
703 Active NMOS transistor region
704 Dielectric isolation layer
706 NMOS gate stack
708 NMOS doped source region
709 NMOS doped drain region
710 NMOS channel region
712 NMOS well connection region with the same width as the n+ source region of the NMOS transistor, which extends as far as the surface and is arranged directly beside the n+ source region for low-impedance drain of generated p-well currents to VSS
713 P-well connection region
716 Silicide blocker layer
753 Active PMOS transistor region
756 PMOS gate stack
758, 759 PMOS source/drain regions
762 N-well connection region
DCRITN Spacing between the NMOS transistors
DLJI, DLJI' Widths of the lateral junction-isolation region in the longitudinal direction
DCH Width of the channel regions in the longitudinal direction
PMOS PMOS-FET
NMOS1 NMOS-FET
NMOS2 NMOS-FET

The invention claimed is:

1. A monolithically integrated metal-oxide semiconductor (MOS) transistor, comprising:
a doped well region of a first conductivity type;
an active MOS transistor region formed in the doped well region, comprising doped source and drain regions of a second conductivity type and at least one MOS channel region extending between the doped source and drain regions under a respective gate stack;
a dielectric isolation layer of a shallow trench isolation (STI) or local oxidation of silicon (LOCOS) type adjacent the active MOS transistor region and laterally surrounding the active MOS transistor region, wherein well portions of the doped well region which adjoin the MOS channel region in the two opposite lateral longitudinal directions oriented perpendicular to a notional connecting line extending from the doped source region through the MOS channel region to the doped drain region, and which well portions extend as far as a surface which is a top side of the active MOS transistor region, so that each respective well portion adjoining the MOS channel region in one of the two opposite lateral longitudinal directions is arranged between the MOS channel region and an inner side of the dielectric isolation layer, which faces the active MOS transistor region, and each respective well portion extends laterally along the notional connecting line from the doped source region through the MOS channel region to the doped drain region;
wherein the surface of the active MOS transistor region above each respective well portion comprises portions that are not covered by the gate stack and are covered by a structured silicide blocker layer made of an electrically insulating material.

2. The MOS transistor according to claim 1, in which a lateral extension of the well portions in the longitudinal direction is between 10 and 500 nanometers.

3. The MOS transistor according to claim 2, in which the gate stack and the MOS channel region extend in a straight line in the longitudinal direction.

4. The MOS transistor according to claim 1, in which at least one additional well portion of the doped well region extends in extension of the notional connecting line from the doped source region to the doped drain region as far as the surface of the active MOS transistor region, said additional well portion of the doped well region being arranged between the doped source region or the doped drain region and the dielectric isolation layer.

5. A monolithically integrated MOS circuit which comprises at least one MOS transistor according to claim 1, and at least one more monolithically integrated component.

6. The MOS circuit according to claim 5, in which the doped drain regions of the MOS transistors of a JICG MOS transistor structure are arranged at a distance from each other in the direction of the connecting line that is at least ten times greater than a predetermined minimum length of the channel region of the MOS transistors achievable by any production technology that is used.

7. A junction-isolated common gate (JICG) MOS transistor structure, containing two MOS transistors of the same conductivity type according to claim 1 and connected in series in a common active MOS transistor region, the gates of which are interconnected, and wherein the doped source/drain regions of a common node of the two MOS transistors are not in a common highly-doped silicon region, but are isolated from each other by the doped well region, and the doped source and drain regions of the common node are electrically connected via a metallic conductive path.

8. A MOS circuit, in which the MOS transistors are embodied in accordance with claim 7.

9. The MOS circuit according to claim 8, in which a second additional well portion of the doped well region extends in one of the MOS transistors of the JICG MOS transistor structure in extension of the notional connecting line from the doped source region to the doped drain region as far as a surface of the active MOS transistor region, wherein the second additional well portion of the doped well region is arranged between the doped source region or the doped drain region and the well connection region.

10. The MOS circuit according to claim 7, in which the JICG MOS transistor structure has not only a first well connection region at one of the longitudinal ends of the doped well region but also a second well connection region between the doped source or drain regions of a first of the two MOS transistors and the doped source or drain regions of a second of the two MOS transistors of the JICG MOS transistor structure.

11. The MOS transistor according to claim 1, in which the gate stack and the MOS channel region extend in a straight line in the longitudinal direction.

* * * * *